(12) United States Patent
Sun

(10) Patent No.: US 9,978,984 B2
(45) Date of Patent: May 22, 2018

(54) METHOD FOR FABRICATING PACKING ASSEMBLY FOR DISPLAY PANEL INCLUDING EXPANDING STACKED PACKING ASSEMBLY SEGMENTS

(71) Applicant: BOE TECHNOLOGY GROUP CO., LTD, Beijing (CN)

(72) Inventor: Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/122,666

(22) PCT Filed: Sep. 18, 2015

(86) PCT No.: PCT/CN2015/090017
§ 371 (c)(1),
(2) Date: Aug. 31, 2016

(87) PCT Pub. No.: WO2017/045204
PCT Pub. Date: Mar. 23, 2017

(65) Prior Publication Data
US 2017/0263885 A1 Sep. 14, 2017

(51) Int. Cl.
*H01L 29/08* (2006.01)
*H01L 51/52* (2006.01)
(Continued)

(52) U.S. Cl.
CPC ...... *H01L 51/5246* (2013.01); *H01L 51/0097* (2013.01); *H01L 51/56* (2013.01); *H01L 2251/5338* (2013.01)

(58) Field of Classification Search
CPC . H01L 51/5246; H01L 51/0097; H01L 51/56; H05K 5/00; H05K 5/0004; H05K 7/00
See application file for complete search history.

(56) References Cited

U.S. PATENT DOCUMENTS

2006/0273304 A1 12/2006 Cok
2015/0043174 A1* 2/2015 Han ................ G02F 1/13452
361/749
(Continued)

FOREIGN PATENT DOCUMENTS

| CN | 104347000 A | 2/2015 |
| CN | 104600208 A | 5/2015 |

(Continued)

OTHER PUBLICATIONS

The World Intellectual Property Organization (WIPO) International Search Report for PCT/CN2015/090017 dated Jun. 7, 2016 p. 1-5.
(Continued)

*Primary Examiner* — Matthew Gordon
(74) *Attorney, Agent, or Firm* — Anova Law Group, PLLC

(57) ABSTRACT

The present disclosure provides a packing assembly for a display panel. The packing assembly includes an adhesive layer, a first surface of the adhesive layer bonded onto a substrate; a plurality of deformable structures, and a plurality of packing assembly segments. The plurality of packing assembly segments are connected by the plurality of deformable structures, the plurality of packing assembly segments and the plurality of deformable structures being bonded onto a second surface of the adhesive layer.

9 Claims, 7 Drawing Sheets

(51) Int. Cl.
*H01L 51/00* (2006.01)
*H01L 51/56* (2006.01)

(56) References Cited

U.S. PATENT DOCUMENTS

2015/0144907 A1 5/2015 Lin et al.
2015/0255747 A1 9/2015 Huang et al.

FOREIGN PATENT DOCUMENTS

| CN | 104637886 A | 5/2015 |
| CN | 104851889 A | 8/2015 |
| CN | 105493308 A | 4/2016 |

OTHER PUBLICATIONS

State Intellectual Property Office of the P.R.C (SIPO) Office Action 1 for 201580000829.4 dated Nov. 1, 2016 p. 1-7.

* cited by examiner

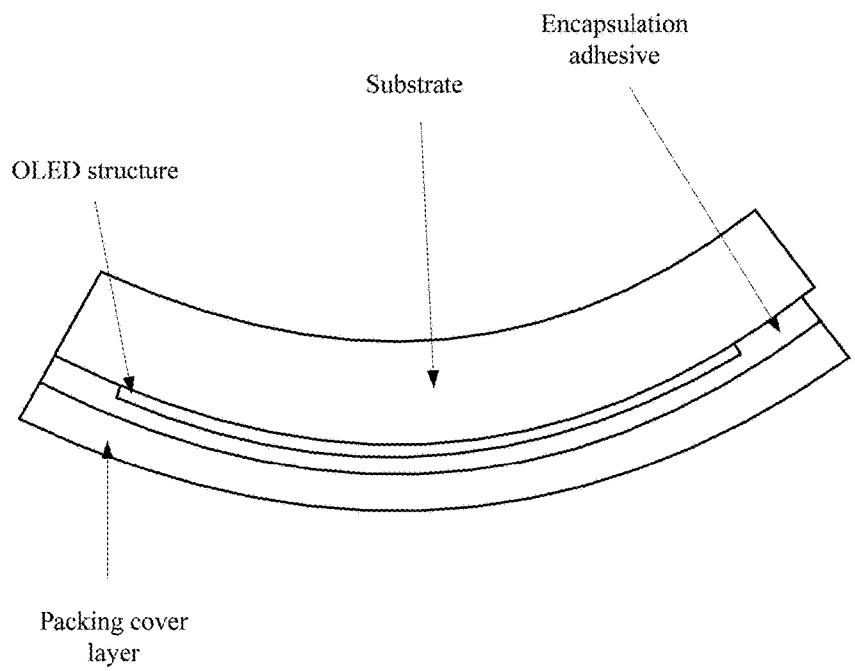
Figure 1 (a) (Prior Art)
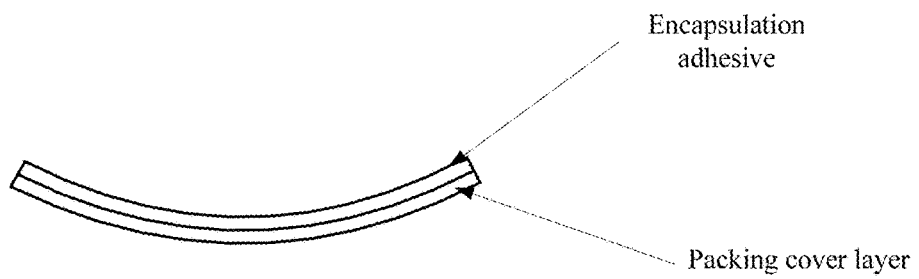
Figure 1 (b1) (Prior Art)
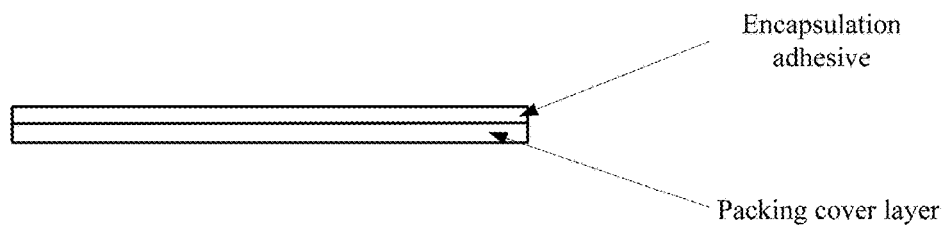
Figure 1 (b2) (Prior Art)

METHOD FOR FABRICATING PACKING ASSEMBLY FOR DISPLAY PANEL INCLUDING EXPANDING STACKED PACKING ASSEMBLY SEGMENTS

This PCT patent application is a national phase entry under 35 U.S.C. § 371 of International Application No. PCT/CN2015/090017, filed on Sep. 18, 2015, the entire content of which is incorporated by reference herein.

FIELD OF THE INVENTION

The present invention generally relates to the display technologies and, more particularly, relates to a packing assembly and fabrication method thereof, a related display panel and related display apparatus.

BACKGROUND

Organic light-emitting diode (OLED) display panels have been widely used in various display devices. OLED display panels are often susceptible to oxygen and moisture, which may cause the OLEDs in the display panels to degrade. Encapsulation or packing materials are used to form encapsulation structures that seal the display panels and prevent the display panels from contacting the outside environment. Hard film layers and liquid filling materials have been used for forming encapsulation layers and structures.

In existing fabrication processes of a curved OLED display panel, external forces are often applied on a flat display panel to bend the flat display panel and keep the display panel in a curved shape. For example, a flat display panel is often placed in a curved structure such as a curved frame. The forces applied by the curved frame may keep the display panel in the properly curved shape. The easier it is to bend a display panel, the less force it is required in the fabrication process to curve the display panel. A display panel with a thin substrate and/or a thin encapsulation structure may require less force to curve. However, thin substrates are often expensive to manufacture. Thin encapsulation structures are more prone to leak moisture and oxygen.

The bending stress on a display panel often determines the structure strength of the panel. In the fabrication process of curved OLED display panels, the substrate and the encapsulation structure often critically affect the characteristics of a curved OLED display panel, such as the bending stress. Glass is commonly used as the material for the substrate of a display panel. Because the glass substrate can be considerably thick, the bending stress of the glass substrate can be high. An existing encapsulation layer may not be able to provide the bending force applied to the display panel/glass substrate. Therefore, an encapsulation structure that is easy to bend may be suitable for fabricating curved OLED display panels.

BRIEF SUMMARY OF THE DISCLOSURE

The present invention at least partially addresses the above problems in the prior art systems. The present disclosure provides a packing assembly and the fabrication method for forming the packing assembly. The packing assembly can provide sufficient support to the entire curved OLED display panel so that the curved OLED display panel may have desired strength. No substantial external stress is added onto the display panel. The tangential stress applied on the packing assembly can be reduced and the packing assembly can be less susceptible to cracking. Further, the packing assembly is easy to handle and thus suitable for the fabrication process of large-sized OLED display panels and curved OLED display panels.

One aspect of the present disclosure includes a packing assembly for a display panel. The packing assembly includes an adhesive layer, a first surface of the adhesive layer bonded onto a substrate; a plurality of deformable structures, and a plurality of packing assembly segments. The plurality of packing assembly segments are connected by the plurality of deformable structures, the plurality of packing assembly segments and the plurality of deformable structures being bonded onto a second surface of the adhesive layer.

Optionally, two adjacent packing assembly segments are connected by one deformable structure such that the plurality of packing assembly segments and the plurality of deformable structures form a packing layer covering at least a portion of the adhesive layer.

Optionally, the one deformable structure fills in a space between the two adjacent packing assembly segments such that the packing layer is continuous.

Optionally, the one deformable structure fills in a portion of a space between the two adjacent packing assembly segments such that the packing layer is discrete.

Optionally, a packing assembly segments is selected from one of squared, circular, oval, triangular, trapezoidal, and polygonal shapes.

Optionally, a cross-section of one of the deformable structures is one or a combination of a polygonal shape, a strip shape, an oval shape, a rhombic shape, and an irregular shape.

Optionally, the deformable structures are made of materials capable of stretching, bending, or a combination of stretching and bending.

Optionally, the deformable structures are made of one or a combination of metal, rubber, and polymer.

Optionally, the deformable structures and the packing assembly segments are made of a same material.

Another aspect of the present disclosure provides a method for fabricating a packing assembly for a display panel. The method includes forming an adhesive layer on a substrate; providing a plurality of packing assembly segments stacked together on one portion of the adhesive layer, two adjacent packing assembly segments being connected by one of a plurality of deformable structures; expanding the stacked packing assembly segments to expose a surface of each packing assembly segment sequentially, the surface facing away from the adhesive layer; and applying a pressing force on each packing assembly segment to bond the packing assembly segment and the adhesive layer.

Optionally, the pressing force is applied on each packing assembly segment individually and sequentially after the packing assembly segment is expanded to contact the adhesive layer and before a next packing assembly segment is expanded to contact the adhesive layer.

Optionally, the pressing force is applied on a plurality of packing assembly segments after the plurality of packing assembly segments are expanded to contact the adhesive layer and before a next packing assembly segment is expanded to contact the adhesive layer.

Optionally, the pressing force is applied on all of the packing assembly segments after all the packing assembly segments are expanded to contact the adhesive layer.

Optionally, the plurality of packing assembly segments and the plurality of deformable structures form a packing layer covering at least a portion of the adhesive layer.

Optionally, the one deformable structure fills in a space between the two adjacent packing assembly segments such that the packing layer is continuous.

Optionally, the one deformable structure fills in a portion of a space between the two adjacent packing assembly segments such that the packing layer is discrete.

Optionally, a packing assembly segment is selected from one of squared, circular, oval, triangular, trapezoidal, and polygonal shapes.

Optionally, a cross-section of one of the deformable structures is one or a combination of a polygonal shape, a strip shape, an oval shape, a rhombic shape, and an irregular shape.

Optionally, the deformable structures are made of materials capable of stretching, bending, or a combination of stretching and bending.

Optionally, the deformable structures are made of one or a combination of metal, rubber, and polymer.

Optionally, the deformable structures and the packing assembly segments are made of a same material.

Another aspect of the present disclosure includes a display panel. The display panel includes the disclosed packing assembly.

Another aspect of the present disclosure includes a display apparatus. The display apparatus includes the disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 1 (*a*) illustrates an existing curved OLED display structure;

FIGS. 1 (*b*1) and 1(*b*2) illustrate two exemplary states of an existing packing structure;

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

FIG. 1 (*a*) illustrates the cross-section view of an existing curved OLED display structure. A substrate supports an OLED structure on a top surface. An existing packing cover layer covers the entire top surface of the substrate. Encapsulation adhesive or adhesive is deposited between the top surface of the substrate containing the OLED structure and the packing cover layer to bond the packing cover layer onto the top surface of the substrate.

The packing cover layer may be a continuous layer to counter the bending force of the bent substrate. When the substrate is bent, the encapsulation adhesive and packing cover layer are bent together with the substrate, as shown in FIG. 1 (*b*1). When the substrate is flat, the encapsulation adhesive and the packing cover layer are flat, as shown in FIG. 1 (*b*2).

Because the substrate is considerably thick, the bending force of the substrate can be high. Thus, the existing curved OLED display structure may bear significant bending stress and may not be strong.

One aspect of the present disclosure provides a packing assembly.

Figure 2:
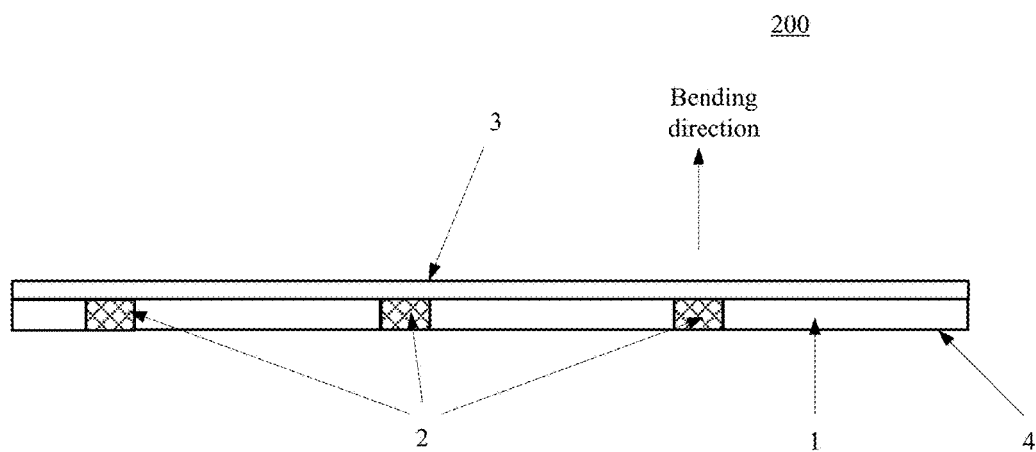
FIG. 2 illustrates the cross-section view of an exemplary packing assembly according to the embodiments of the present disclosure.

FIG. 2 illustrates an exemplary packing structure or packing assembly 200 when the packing assembly 200 is flattened. The packing assembly 200 may be a transparent cover layer. The packing assembly 200 may include packing assembly segments 1, deformable structures 2, and an encapsulation adhesive layer 3. The encapsulation adhesive layer 3 may be any adhesive layer, such as glue, to provide adhesion between a substrate and the packing assembly segments 1. The deformable structures 2 may be any suitable structures capable of connecting adjacent packing assembly segments 1 and changing shapes during bending and/or stretching. For example, the deformable structures 2 may be hinge structures. One surface of the encapsulation adhesive layer 3 may be bonded to the substrate (not shown). The packing assembly segments 1, connected by the deformable structures 2, may be bonded or attached onto the other surface of the encapsulation adhesive layer 3. The potential bending direction of the substrate and the packing structure 200 is illustrated by the arrow.

A plurality of packing assembly segments 1 and a plurality of deformable structures 2 may be provided and bonded onto the encapsulation adhesive layer 3. Two adjacent packing assembly segments 1 may be connected by one deformable structure 2. The deformable structure 2 may fill up the space between two adjacent packing assembly segments 1. A packing layer 4 may be formed. The packing layer 4 may be an encapsulation layer. In one embodiment, the packing layer 4 may be a continuous layer. In this case, the term "continuous" may refer to a deformable structure, connecting two adjacent packing assembly segments 1, fully filling the space between the two adjacent packing assembly segments 1. The adhesive layer 3 may be of a liquid or a solid material.

The packing assembly segments 1 may be made of suitable hard materials such as glass, metal, polymers, semiconductor elements, and ceramics. The packing assembly segments 1 may be water-resistant. The shape of a packing assembly segment 1 may be squared, circular, oval, triangular, trapezoidal, polygonal, or irregular. The deformable structure 2 may have a polygonal shape, a strip shape, an oval shape, a rhombic shape, an irregular shape, and so on. The deformable structure 2 may be made of metal, rubber, polymer, or any other suitable materials capable of stretching and bending. The deformable structure 2 may be made of the same material as the packing assembly segments 1. The deformable structure 2 may also be made of a different material than the packing assembly segments 1. The deformable structure 2 may be thicker or thinner than the corresponding packing assembly segments 1. The thickness of the deformable structure 2 may also be the same as the thickness of the packing assembly segment 1. In one embodiment, the thickness of the deformable structure 2 and the thickness of the packing assembly segment 1 may both be about 1 to 50 mm.

In various embodiments, the deformable structure 2 may be made of water absorbing, water resistant, or water proof materials. The deformable structures 2 may enhance or improve the water and oxygen resistance of the packing layer 4.

Figure 3:
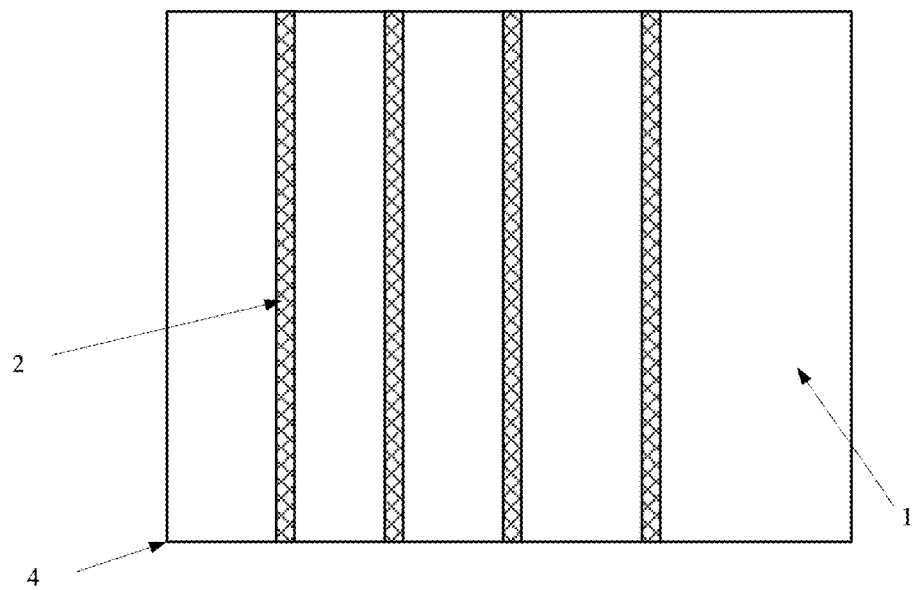
FIG. 3 illustrates the back view of an exemplary packing assembly according to the embodiments of the present disclosure.

FIG. 3 illustrates a back view of the packing assembly 200 shown in FIG. 2. A plurality of packing assembly segments 1 may be connected by a plurality of deformable structures 2. In one embodiment, two packing assembly segments 1 may be connected by one deformable structure 2. The deformable structures 2 may each be a strip and the packing assembly segments 1 may each be of a rectangular shape. The plurality of deformable structures 2 may be connected to form a packing layer 4. The overall packing layer 4 may be continuous and may cover at least a substantial portion of the encapsulation adhesive layer 3. The packing structure 200 may cover at least a substantial portion of the substrate (not shown).

Figure 4:
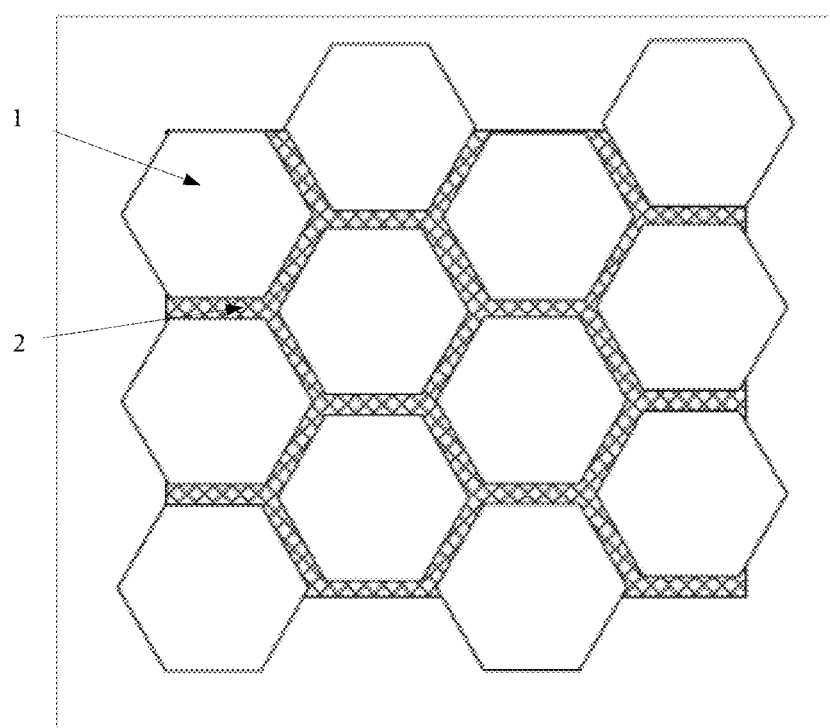
FIG. 4 illustrates the back view of another exemplary packing assembly according to the embodiments of the present disclosure.

The packing assembly segments 1 may also be of other shapes. FIG. 4 illustrates the back view of another exemplary packing structure. In this example, the packing assembly segments 1 may have a hexagonal, i.e., polygonal shape. The deformable structure 2 may form a net-shaped structure to connect adjacent packing assembly segments 1. Each packing assembly segment 1 may be surrounded by a portion of the deformable structure 2 and the deformable structure 2 may fill up the space between adjacent packing assembly segments 1. A plurality of packing assembly segments 1 and the deformable structures 2 may form a continuous cover on the encapsulation adhesive layer.

Figure 5:
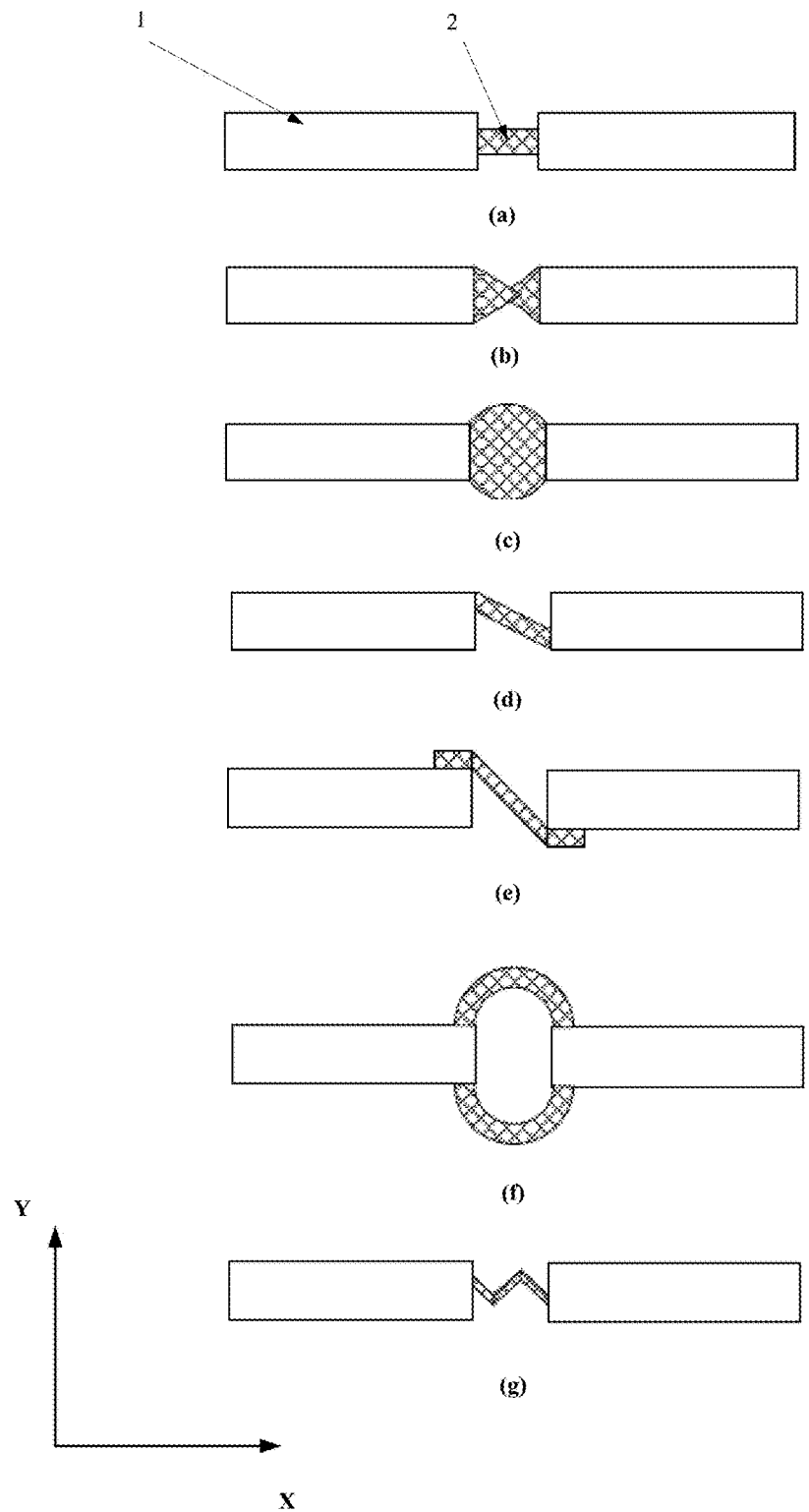
FIG. 5 illustrates cross-section views of exemplary deformable structures along an A-A' direction of FIG. 3 according to the embodiments of the present disclosure.

The deformable structures 2 may have different shapes and the deformable structures 2 may also not fill up the space between adjacent packing assembly segments 1. That is, in some embodiments, the overall packing layer 4 may be discontinuous, i.e., may be discrete. In this case, the term "discrete" or "discontinuous" may refer to a deformable structure 2, connecting two adjacent packing assembly segments 1, not fully filling the space between the two adjacent packing assembly segments 1. The shapes of the deformable structures 2 may be determined or adjusted according to different applications or designs. For illustrative purposes, in FIG. 5, only the packing assembly segment 1 and the deformable structure 2 in FIG. 5 (*a*) are labeled. In FIG. 5, (*a*) to (*g*) parts illustrate exemplary cross-section views of different deformable structures 2 used in various embodiments along the A-A' direction in FIG. 3. For illustrative purposes, the two adjacent packing assembly segments 1 and the deformable structure 2 in between in FIG. 5 may correspond to two adjacent packing assembly segments 1 and the deformable structure 2 in between in FIG. 3.

As shown in FIG. 5 (*a*) to (*g*), two adjacent packing assembly segments 1 may be connected by one or more deformable structures 2. The one or more deformable structures 2 for connecting the two adjacent packing assembly segments 1 may have the same cross-sectional shape or have different cross-sectional shapes. A deformable structure 2 may have a rectangular cross-sectional shape (5 (*a*)), with a width in the Y direction less than the width of the connected packing assembly segments 1. A deformable structure 2 may also have a bow-tie cross-sectional shape (5 (*b*)), a circular cross-sectional shape (5 (*c*)), a rhombus cross-sectional shape (5 (*d*)), a zig-zag cross-sectional shape (5 (*e*) and (*g*)), and a U cross-sectional shape (5 (*f*)). It should be noted that the components in FIG. 5 are only for illustrative purposes and do not represent the actual sizes or ratio of the components. Other suitable shapes of deformable structures 2 may also be used according to different applications or designs. The number of deformable structures 2 used to connect adjacent packing assembly segments 1 may be determined or adjusted according to different applications or designs.

Figure 6:
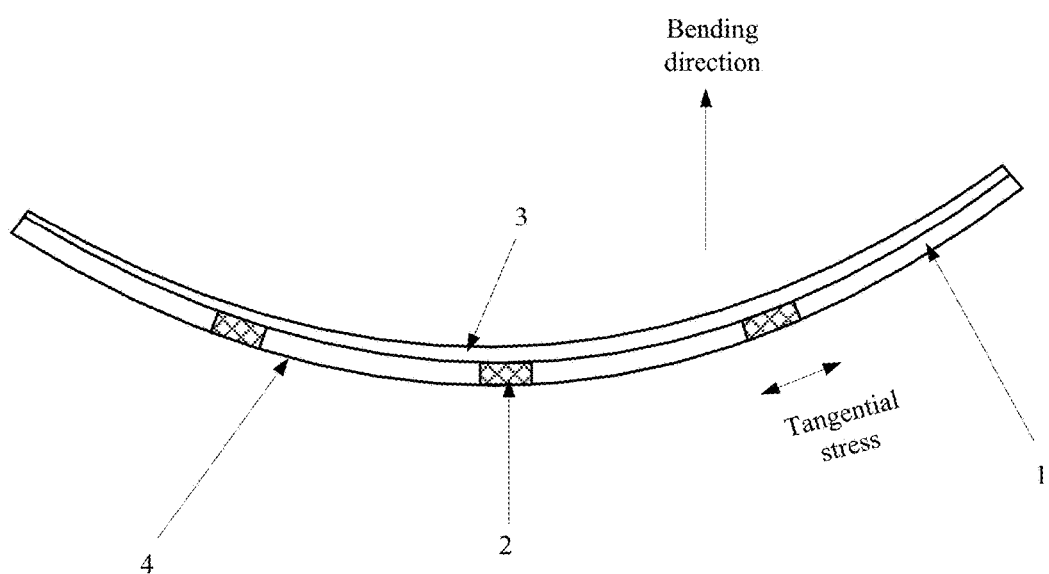
FIG. 6 illustrates another cross-section view of the exemplary packing assembly according to the embodiments of the present disclosure.

FIG. 6 illustrates the cross-section view of the packing structure 200, shown in FIG. 2 when the packing structure 200 is bent along the bending direction illustrated by the arrow. The encapsulation adhesive layer 3 may be bonded or attached to a substrate (not shown). A plurality of packing assembly segments 1 may be connected by a plurality of deformable structures 2. Two adjacent packing assembly segments 1 may be connected by one deformable structure 2. The packing assembly segments 1, connected by the deformable structures 2, may form a continuous packing layer 4 on the encapsulation adhesive layer 3. The packing layer 4 may be bonded on the substrate through the encapsulation adhesive layer 3.

When the substrate is bent along the bending direction, the packing structure 200 may be bent with the substrate. Tangential stress, shown by the double arrow, may be formed or increased along the tangential direction of the packing structure 200. Compared to a conventional packing structure, because the deformable structures 2 are stretchable, some of the tangential stress is neutralized by each deformable structure 2. The packing assembly segments 1 and the entire packing structure 200 may be less susceptible to being damaged or cracked due to the bending.

Another aspect of the present disclosure provides a process to fabricate a packing assembly.

Figure 7:
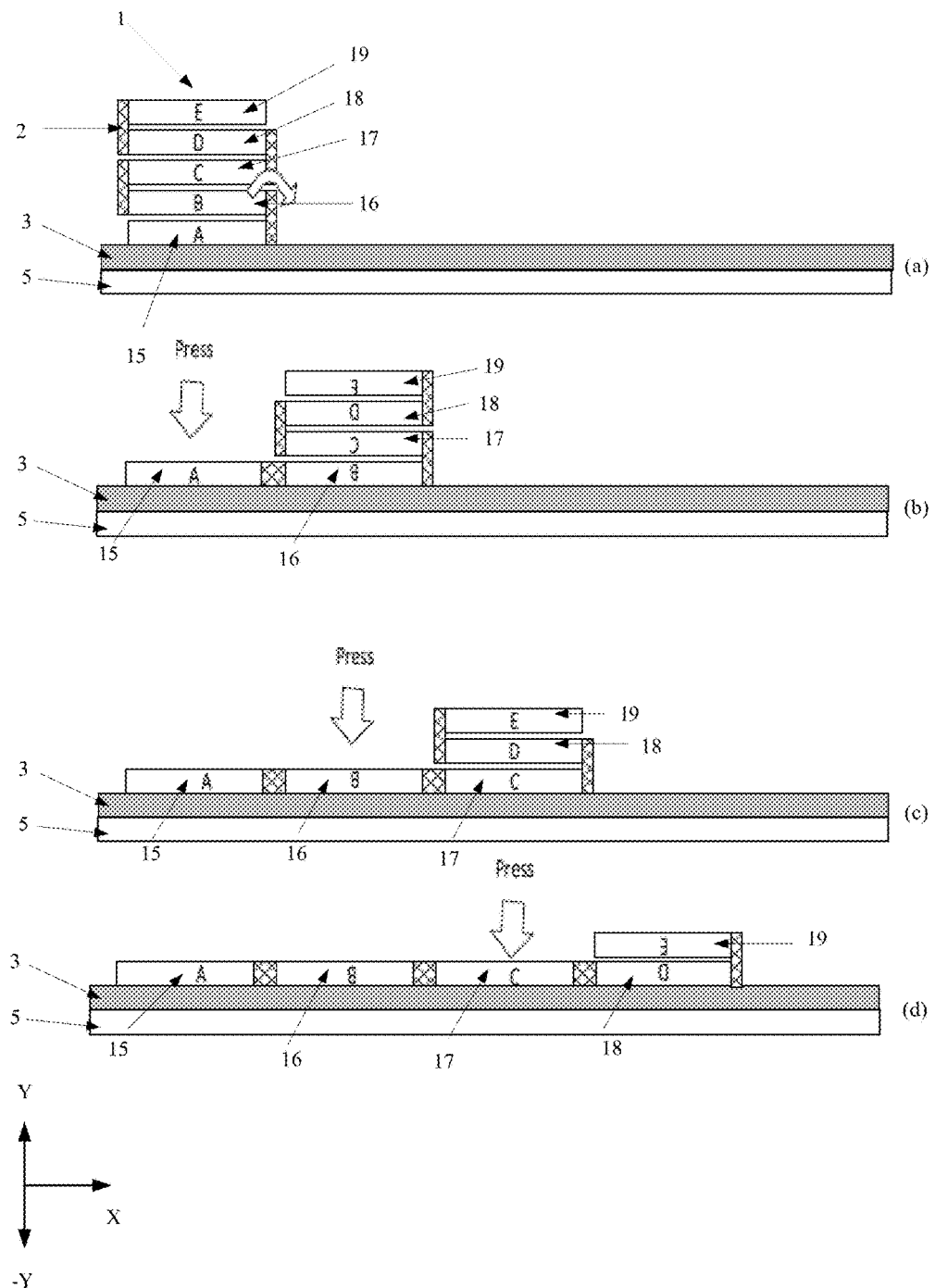
FIG. 7 illustrates an exemplary fabrication process of the packing assembly according to the embodiments of the present disclosure.

FIG. 7 illustrates an exemplary process to fabricate the packing assembly 200 shown in FIG. 2. Different stages of the fabrication process illustrated in FIG. 7 are shown from steps S1 to S2 in FIG. 8.

In step S1, an encapsulation adhesive layer is formed on a substrate. A plurality of deformable structures and a plurality of packing assembly segments are provided such that the packing assembly segments are stacked together on a first packing assembly segment with the back surface of the first packing assembly segment contacting the encapsulation adhesive layer.

Figure 8:
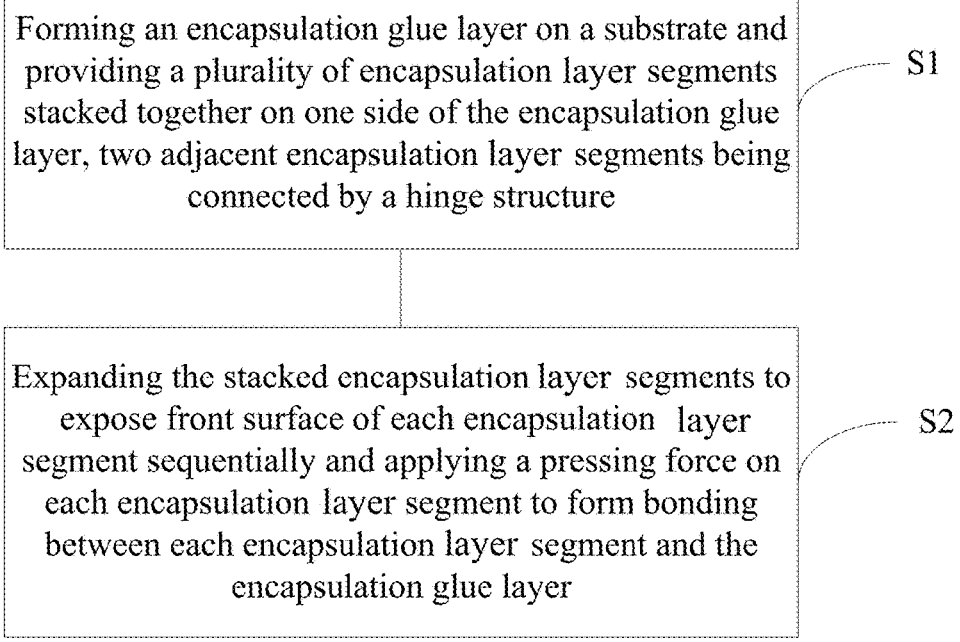
FIG. 8 illustrates the process flow of the exemplary fabrication process illustrated in FIG. 7.

As shown in FIG. 7 (*a*) and FIG. 8, the encapsulation adhesive layer 3 may be formed on a surface of a substrate 5. A plurality of packing assembly segments 1, connected by a plurality of deformable structures 2, may be provided. For illustrative purposes, five packing assembly segments 1, i.e., the first packing assembly segment 15 to the fifth packing assembly segment 19, are used to describe the process. For illustrative purposes, each packing assembly segment 1 may be marked with a marking letter, e.g., from A to E, to indicate the position or orientation of the packing assembly segment 1 during the fabrication process. As shown in FIG. 7, the first packing assembly segment 15 may be marked with A; the second packing assembly segment 16 may be marked with B; the third packing assembly segment 17 may be marked with C; the fourth packing assembly segment 18 may be marked with D; and the fifth packing assembly segment 19 may be marked with E.

At the beginning of the fabrication process, as shown in FIG. 7 (a), the packing assembly segments 1 may be stacked in a way that all the marking letters, i.e., the front surface of each packing assembly segment 1, may face upward, e.g., along a Y direction. The second packing assembly segment 16 to the fifth packing assembly segment 19 may be stacked together on the first packing assembly segment 15 and placed on one side of the encapsulation adhesive layer 3. The second packing assembly segment 16 may be stacked on the first packing assembly segment 15; the third packing assembly segment 17 may be stacked on the second packing assembly segment 16; the fourth packing assembly segment 18 may be stacked on the third packing assembly segment 17; and the fifth packing assembly segment 19 may be stacked on the fourth packing assembly segment 18. The back surface of the first packing assembly segment 15 may contact the encapsulation adhesive layer 3. In various embodiments, other numbers of packing assembly segments can be used to form the packing structure. It should be noted that, the marking letters are only for illustrative purposes. In practice, the marking letters may not be used in the fabrication process. Two adjacent packing assembly segments 1 may be connected by a deformable structure 2. The stacked packing assembly segments 1 and the deformable structures 2 connecting the packing assembly segments 1 may be unfolded along the encapsulation adhesive layer 3 to form a flat packing layer in subsequent step.

In step S2, the stacked packing assembly segments are expanded to expose a surface of each packing assembly segment sequentially. The exposed surface may be the surface, of the packing assembly segment, facing away from the encapsulation adhesive layer. A pressing force is applied on the each packing assembly segment to bond the packing assembly segments and the encapsulation adhesive layer.

As shown in FIG. 7 (a) and FIG. 8, the stacked packing assembly segments 1 may be expanded (e.g., unfolded or rolled out) along the X direction, e.g., the horizontal direction, to expose the front surface of the first packing assembly segment 15. First, as indicated by the arrow, the back surface of the second packing assembly segment 16 may contact the encapsulation adhesive layer 3, and the rest of the packing assembly segments 17 to 19 may be stacked on the second packing assembly segment 16. When unfolding the second packing assembly segment 16, the rest of the packing assembly segments 1 may be adjusted to be stacked on the second packing assembly segment 16. As shown in FIG. 7 (b) and the marking letter A, the front surface of the first packing assembly segment 15 may face upward, i.e., along the Y direction. The front surfaces of the packing assembly segments 16 to 19 may face downward, i.e., along the (−Y) direction, as shown by the flipped marking numbers B to E. The minus "−" sign may be used to indicate a direction opposite of the Y direction.

A pressing force may be applied on the first packing assembly segment 15 to create or enhance the bonding between the first packing assembly segment 15 and the encapsulation adhesive layer 3.

Further, as shown in FIG. 7 (c) to (d), the third packing assembly segment 17 and the fourth packing assembly segment 18 may be expanded in a similar way. The third packing assembly segment 17 may be expanded such that the front surface of the third packing assembly segment 17 may face upward, as shown by the marking letter C. A pressing force may be applied on the second packing assembly segment 16 after the third packing assembly segment 17 contacts the encapsulation adhesive layer 3 and before the fourth packing assembly segment 18 is expanded to contact the encapsulation adhesive layer 3. The fourth packing assembly segment 18 may be stacked on the third packing assembly segment 17; and the fifth packing assembly segment 19 may be stacked on the fourth packing assembly segment 19. The third packing assembly segment 17 to the fifth packing assembly segment 19 may be stacked in a way that the front surfaces of each packing assembly segment 1 may face upward, as indicated by the marking letters C to E. Similarly, a pressing force may be applied on the third packing assembly segment 17 after the fourth packing assembly segment 18 contacts the encapsulation adhesive layer 3 and before the fifth packing assembly segment 19 is expanded to contact the encapsulation adhesive layer 3.

The fourth packing assembly segment 18 and the fifth packing assembly segment 19 may be stacked in a way that the front surfaces of the fourth packing assembly segment 18 and the fifth packing assembly segment 19 may be face downward, as indicated by the flipped marking letters D and E. Further, the last packing assembly segment, illustrated by the fifth packing assembly segment 19, may be expanded to contact the encapsulation adhesive layer 3, and a pressing force may be applied on the fifth packing assembly segment 19. The back surface of the fifth packing assembly segment 19 may contact the encapsulation adhesive layer 3 such that the front surface of the fifth packing assembly segment 10 may face upward (not shown).

It should be noted that, the pressing force applied on each packing assembly segment 1, may be different or the same. In one embodiment, the pressing force applied on each packing assembly segment 1 may be the same. The pressing force may be applied on each packing assembly segment 1 individually and sequentially, after the packing assembly segment 1 contacts the encapsulation adhesive layer 3 and before the next packing assembly segment 1 is expanded to contact the encapsulation adhesive layer 3. Alternatively, the pressing force may be applied on more than one packing assembly segments 1 simultaneously after more than one packing assembly segments 1 are expanded to contact the encapsulation adhesive layer 3. Also, the pressing force may be applied on all the packing assembly segments 1 simultaneously after all the packing assembly segments 1 are expanded to contact the encapsulation adhesive layer 3. In one embodiment, the pressing force may be applied on each packing assembly segment 1 individually and sequentially. The specific timing to apply the pressing force should not be limited by the embodiments of the present disclosure.

Embodiments of the present disclosure may provide a display apparatus incorporating the display panel provided by the present disclosure. Exemplarily, the display apparatus according to the embodiments of the present disclosure can be used in any product with display functions such as a display panel, a television, an LCD, an OLED, an electronic paper, a digital photo frame, a mobile phone and a tablet computer.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A method for fabricating a packing assembly for a display panel, comprising:
   forming an adhesive layer on a substrate;
   providing a plurality of packing assembly segments stacked together on one portion of the adhesive layer, two adjacent packing assembly segments being connected by one of a plurality of deformable structures;
   expanding the stacked packing assembly segments to expose a surface of each packing assembly segment sequentially, the surface facing away from the adhesive layer; and applying a pressing force on each packing assembly segment to bond each packing assembly segment and the adhesive layer.

2. The method according to claim 1, wherein the pressing force is applied on each packing assembly segment individually and sequentially after the packing assembly segment is expanded to contact the adhesive layer and before a next packing assembly segment is expanded to contact the adhesive layer.

3. The method according to claim 1, wherein the pressing force is applied on a subgroup of the plurality of packing assembly segments after the subgroup of the plurality of packing assembly segments are expanded to contact the adhesive layer and before a next packing assembly segment is expanded to contact the adhesive layer.

4. The method according to claim 1, wherein the pressing force is applied on all of the packing assembly segments after all the packing assembly segments are expanded to contact the adhesive layer.

5. The method according to claim 1, wherein the plurality of packing assembly segments and the plurality of deformable structures form a packing layer covering at least a portion of the adhesive layer.

6. The method according to claim 1, wherein the one deformable structure fills in a space between the two adjacent packing assembly segments to form a continuous encapsulation layer.

7. The method according to claim 1, wherein the one deformable structure fills in a portion of a space between the two adjacent packing assembly to form a discrete packing layer.

8. The method according to claim 1, wherein a cross-section of one of the deformable structures is one or a combination of a polygonal shape, a strip shape, an oval shape, a rhombic shape, and an irregular shape.

9. The method according to claim 1, wherein the deformable structures are made of material capable of stretching, bending, or a combination of stretching and bending.

* * * * *